(12) United States Patent
Reiderman

(10) Patent No.: US 11,047,815 B2
(45) Date of Patent: Jun. 29, 2021

(54) METHOD AND APPARATUS FOR NUCLEAR MAGNETIC RESONANCE MEASUREMENTS ON BOREHOLE MATERIALS

(71) Applicant: Arcady Reiderman, Richmond, TX (US)

(72) Inventor: Arcady Reiderman, Richmond, TX (US)

( * ) Notice: Subject to any disclaimer, the term of this patent is extended or adjusted under 35 U.S.C. 154(b) by 48 days.

(21) Appl. No.: 16/409,779

(22) Filed: May 11, 2019

(65) Prior Publication Data
US 2019/0346385 A1 Nov. 14, 2019

Related U.S. Application Data

(60) Provisional application No. 62/670,018, filed on May 11, 2018.

(51) Int. Cl.
| | | |
|---|---|---|
| *G01V 3/00* | (2006.01) | |
| *G01N 24/08* | (2006.01) | |
| *G01R 33/56* | (2006.01) | |
| *G01R 33/58* | (2006.01) | |

(52) U.S. Cl.
CPC ........... *G01N 24/081* (2013.01); *G01R 33/56* (2013.01); *G01R 33/583* (2013.01)

(58) Field of Classification Search
CPC .............. G01R 33/543; G01R 33/5659; G01R 33/3415; G01R 33/36; A61B 5/055
USPC .......................................................... 324/309
See application file for complete search history.

(56) References Cited

U.S. PATENT DOCUMENTS

| | | | | |
|---|---|---|---|---|
| 4,035,776 A | * | 7/1977 | Socha .................... | G01T 1/1647 346/33 B |
| 4,695,800 A | * | 9/1987 | Kramer ............. | G01R 33/56554 324/309 |
| 5,341,098 A | * | 8/1994 | Hennig ................ | G01R 33/446 324/309 |
| 2004/0032258 A1 | * | 2/2004 | Blumich .................. | G01V 3/32 324/303 |
| 2005/0065431 A1 | * | 3/2005 | Reiderman ............ | A61B 5/055 600/415 |
| 2006/0058634 A1 | * | 3/2006 | Ikezaki .............. | G01R 33/4828 600/410 |
| 2015/0027217 A1 | * | 1/2015 | Kats ..................... | G01N 33/383 73/152.11 |
| 2017/0153346 A1 | * | 6/2017 | Biswas ..................... | G01V 1/48 |
| 2017/0212263 A1 | * | 7/2017 | Zhang ...................... | G01V 1/40 |
| 2018/0364317 A1 | * | 12/2018 | Shen .................... | G01R 33/543 |

* cited by examiner

*Primary Examiner* — Walter L Lindsay, Jr.
*Assistant Examiner* — Frederick Wenderoth

(57) ABSTRACT

A method (and apparatus) for NMR relaxation measurements on borehole materials (e.g., drill cuttings, sidewall cores and whole cores) is based on combining an FID signal and spin-echo signals to obtain relaxation properties of a sample having fast relaxation components. The method comprises acquiring NMR signals from the sample, acquiring calibration NMR signals and acquiring a background signal (e.g., ringing after an excitation pulse). The background signal may be acquired using an additional static magnetic field to substantially spoil the NMR excitation volume in the sample. The acquired signals are processed to obtain a nuclear magnetic resonance relaxation property of the sample with at least one (first point) on the relaxation data produced from the FID and with the background data eliminated from the relaxation data.

20 Claims, 16 Drawing Sheets

METHOD AND APPARATUS FOR NUCLEAR MAGNETIC RESONANCE MEASUREMENTS ON BOREHOLE MATERIALS

CROSS-REFERENCE TO RELATED APPLICATIONS

This application is related to a provisional patent application claiming the benefit 35 USC 119(e). The provisional patent application number is U.S. 62/670,018; filing date is May 11, 2018.

STATEMENT REGARDING FEDERALLY SPONSORED RESEARCH OR DEVELOPMENT

Not applicable.

FIELD OF THE INVENTION

This invention relates to a low frequency nuclear magnetic resonance (NMR) for the oil bearing earth formations evaluation purposes. More specifically the invention applies to the NMR measurement performed on the surface, in particular on the well site, in order to support drilling processes.

BACKGROUND OF THE INVENTION

Low frequency NMR relaxation measurements are performed as apart of earth formations evaluation during and after drilling of an oil well. The measurement can be performed downhole and on the surface at the well site or in a laboratory. This invention relates to the surface NMR measurements on borehole materials. The materials may include continuous drill core, rotary sidewall cores, core stacks, core plugs, individual hand specimens, bulk samples, unwashed cuttings, washed and dried cuttings, microcores, drilling fluids and others.

Surface NMR relaxation measurements are typically conducted in laboratory using a standard or specialized NMR relaxometer that includes a permanent magnet that generates a static magnetic field and a NMR antenna generating a radio-frequency (RF) magnetic field that is perpendicular to the static magnetic field. The static magnetic field aligns nuclei in a sample with the direction of the static magnetic field. The rate at which the bulk magnetization is established is described by a spin-lattice relaxation (also called longitudinal relaxation) characterized by a time constant T1. The RF magnetic field is typically applied in a form of a sequence of RF pulses (e.g., a standard CPMG pulse sequence) to produce a sequence of spin echoes. The amplitudes of the spin echoes produced by a standard CPMG pulse sequence make points of a spin-spin relaxation curve (also called transversal relaxation curve) characterized by a time constant T2. The total amplitude of the relaxation curve and the distribution of the relaxation times T2 and T1 are the NMR properties that can be interpreted to relate them to petrophysical parameters of the borehole materials, e.g. porosity, pore size distribution, amount of bound and free fluids in the pore space, wettability of the pore surface, and others.

The NMR relaxation measurements on borehole materials are a low frequency NMR relaxometry that intends to match 0.4 Mhz-2 Mhz frequency range of typical downhole NMR measurement so the downhole and surface NMR measurements can complement each other.

In existing configurations, a NMR relaxometer performs measurements in a core laboratory on core plugs or whole cores manually loaded in a sample holder. The existing configurations of apparatus and methods do not address functionality desired for cost efficient, high throughput automated measurements, in particular, the well-site measurements, including measurement on drill cuttings to support drilling process. The existing configurations of apparatus and methods of the surface NMR relaxometry also do not adequately address the following aspects: enhance formation evaluation by combining surface and downhole NMR data, acquiring fast relaxation components of transversal NMR relaxation with low-field NMR, NMR measurement on samples with a moisture barrier and others.

Therefore, there is a need for efficient surface NMR measurement apparatus and methods that address the above-mentioned deficiencies of the existing low frequency NMR relaxometry.

BRIEF SUMMARY OF THE INVENTION

One aspect of the present invention is an apparatus to conduct automated bulk sensitive measurements on a sample of a borehole material. The apparatus comprises a sensing unit having a sensitivity area, a sample cassette loaded with a batch of samples of the borehole material to be analyzed and a sample transfer unit to automatically move the sample in and out of the sensitivity area. The apparatus preferably has at least one sample containing a known substance to be used for automatic calibration of the apparatus. One sample in the batch may be a drilling mud sample. The apparatus may include an auxiliary sensor to measure at least one of (i) weight, (ii) volume and (iii) density of the borehole material in the sample. In a preferred embodiment the sensing unit is a NMR sensing unit to acquire NMR relaxation data, the sensing unit comprising a source of a radio-frequency magnetic field in a form of a sequence of RF pulses having a waiting time between the sequences and a source of a static magnetic field. The sample transfer unit is used for at least one of (i) placing at least one sample in the sensitive area and (ii) periodically move the sample between two sensitivity areas during the waiting time to enable two-region NMR measurements in one measurement cycle and therefore increase the measurement throughput. The NMR sensing unit may define an NMR detection region, which is selected by selecting a spatial distribution of the radio-frequency magnetic field or selecting a frequency bandwidth of the radio-frequency magnetic field and a gradient of the static magnetic field. In another embodiment of the apparatus the sensing unit is a natural gamma spectroscopy sensing unit to acquire natural gamma-ray spectroscopy data, in particular, the concentrations of U (Uranium), Th (Thorium) and K (Potassium) in the borehole material.

Another aspect of the present invention is a method for an automated NMR measurement on a sample of a borehole material, comprising: providing a NMR sensing unit generating a radio-frequency magnetic field and a static magnetic field, automatically transferring the sample into a sensitivity area of the sensing unit, determining a sample sensitivity volume affected by the measurement, acquiring NMR data from the sample sensitivity volume and using the data to characterize earth formations while drilling an oil well. The method may include selecting the sample sensitivity volume by selecting one of (i) spatial distribution of the radio-frequency magnetic field and (ii) frequency spectrum bandwidth of the radio-frequency magnetic field in relation to a gradient of the static magnetic field. The method may also include measuring a volume of the whole sample, having an unknown irregular shape. Measuring the volume of the sample may comprise filling a sample container with a fluid, determining the volume of the fluid based on an NMR signal and subtracting the volume of the fluid from the volume of the container. Alternatively, the method may include acquiring a magnetic resonance image of the sample to determine the volume of the sample. Yet another way to assess the volume may include measuring weight of the sample and carrying out its bulk density scan. The method may include performing adaptive data stacking until either a desired signal-to-noise ratio of the data or a time limit for the measurement is reached. The method may also include an on-the-fly frequency tuning using the sample to be analyzed. The method may further include switching between two sensitivity areas to enable two-region NMR measurements in one measurement cycle and therefore increase the measurement throughput. The method may also include joint interpretation of at least two of (i) surface NMR data obtained on borehole materials, (ii) downhole NMR data, (iii) surface natural gamma-ray spectroscopy data obtained on borehole materials and (iv) downhole natural gamma-ray data to characterize earth formations while drilling an oil well.

Yet another aspect of the present invention is a method for NMR measurement on a whole core. The method includes the steps of generating a radio-frequency magnetic field in a form of sequences of radio-frequency pulses having a waiting time between the sequences and generating a static magnetic field, the radio-frequency magnetic field and the static magnetic field determine a sensitivity volume affected by the NMR measurement. The method also includes switching between at least two sensitivity volumes during the waiting time to enable at least two-region NMR measurements in one measurement cycle and therefore increase the measurement throughput. The method further includes repeating the measurement cycles at different positions on the core to produce a one-dimensional image of the NMR relaxation properties of the core.

The present disclosure also provides a method for nuclear magnetic resonance measurement on a sample of a borehole material, comprising: applying a static magnetic field, generating an at least one sequence of pulses of a radio-frequency magnetic field, the static magnetic field and the radio-frequency magnetic field defining a sensitivity volume. The method further comprises acquiring a free induction decay signal from the sample of a borehole material, acquiring an at least one spin-echo signal from the sample of a borehole material, acquiring a calibration signal, processing the free induction decay signal, the at least one spin-echo signal and the calibration signal to obtain a nuclear magnetic resonance relaxation property of the sample of a borehole material. The method may further comprise acquiring a background signal and processing the background signal together with the free induction decay signal, the at least one spin-echo signal and the calibration signal to obtain a nuclear magnetic resonance relaxation property of the sample of a borehole material. Acquiring the background signal may include applying an additional static magnetic field to substantially eliminate the sensitivity volume in the sample of a borehole material.

Other aspects and advantages of the present disclosure will be apparent from the following description.

BRIEF DESCRIPTION OF THE DRAWINGS

For a detailed description of the embodiments of the invention, reference will now be made to the accompanying drawing in which like numerals refer to like elements. The drawings are included to illustrate certain aspects of the present disclosure, and should not be viewed as exclusive embodiments. The subject matter disclosed is capable of considerable modifications, alterations, combinations, and equivalents in form and function, without departing from the scope of this disclosure.

DETAILED DESCRIPTION OF THE INVENTION

Embodiments of this disclosure are directed to NMR relaxation measurements conducted on borehole materials including continuous drillcore, rotary sidewall cores, core stacks, core plugs, individual hand specimens, bulk samples, unwashed cuttings, washed and dried cuttings, micro-cores, drilling fluids and others.

Figure 1A:
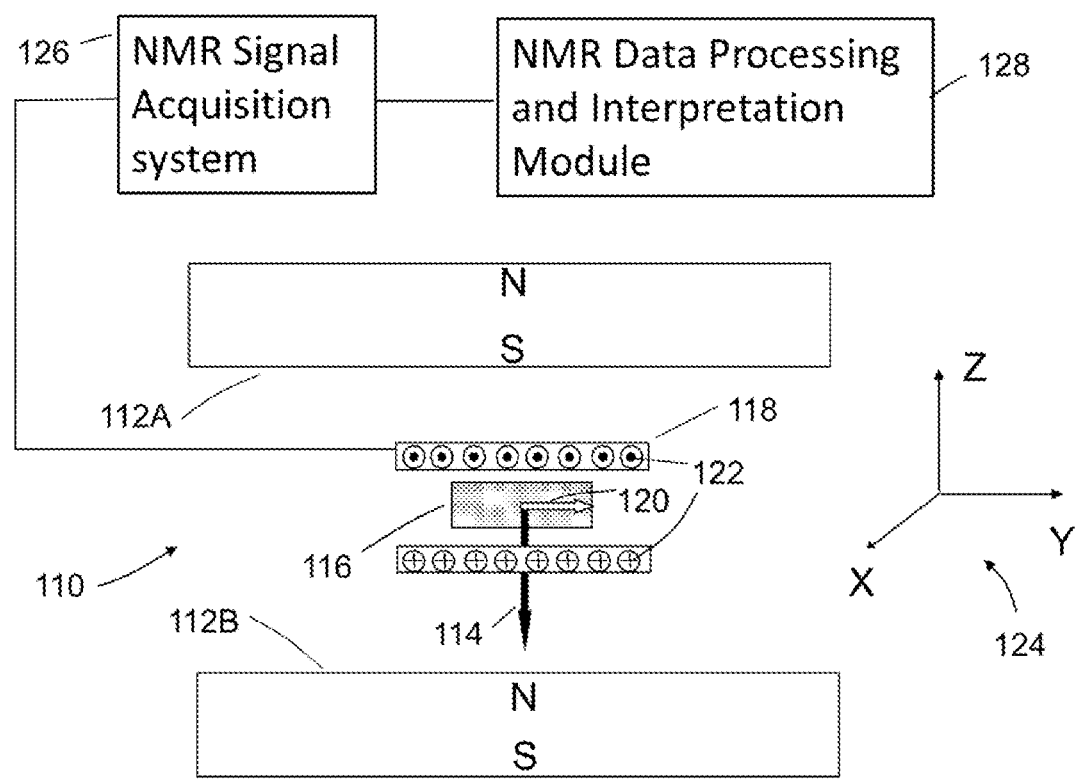
FIG. 1A and FIG. 1B show an exemplary embodiment of a low field NMR relaxometer without and with a sample transfer system.

FIG. 1A shows some general components of a NMR relaxometer that are present in disclosed embodiments. It includes a sensing unit 110 comprising a permanent magnet assembly shown in a form of two magnet pieces 112A and 112B magnetized in the same direction. The magnet assembly generates a static magnetic field 114 (either substantially homogeneous or gradient magnetic field) in a sample 116. A NMR antenna 118 generating a radio-frequency (RF) magnetic field 120 in the sample 116. The sample may have a cylindric shape and the coil may be a solenoid coil coaxial with the axis of the sample. Direction of RF current in the antenna wire is shown at 122. The NMR antenna 118 may be used for both generating the RF magnetic field in the sample and receiving NMR signals from the sample. In the Cartesian coordinate system shown at 124 the static magnetic field is in Z-direction, the RF magnetic field and the sensitivity direction of the RF antenna is in Y-direction. The NMR antenna 118 is connected to the NMR signal acquisition system 126. The acquisition system supplies the RF current in a form of a NMR pulse sequence when exciting NMR in the sample and receive NMR signals emanating from the sample in response to the NMR pulse sequence. The magnet assembly 112A, 112B is preferably configured to generate the static magnetic field 114 in vertical direction (Z-direction) to make the field measurement insensitive to positioning of the sensing unit 110 on a horizontal plane: rotating the magnet assembly while keeping magnetic field vertical does not change the angle of the magnetic field with respect to the Earth's magnetic field.

NMR data processing and interpretation module 128 is used to process the received NMR signals and invert the processed data for NMR parameters that can be related to petrophysical properties of the sample.

Figure 1B:
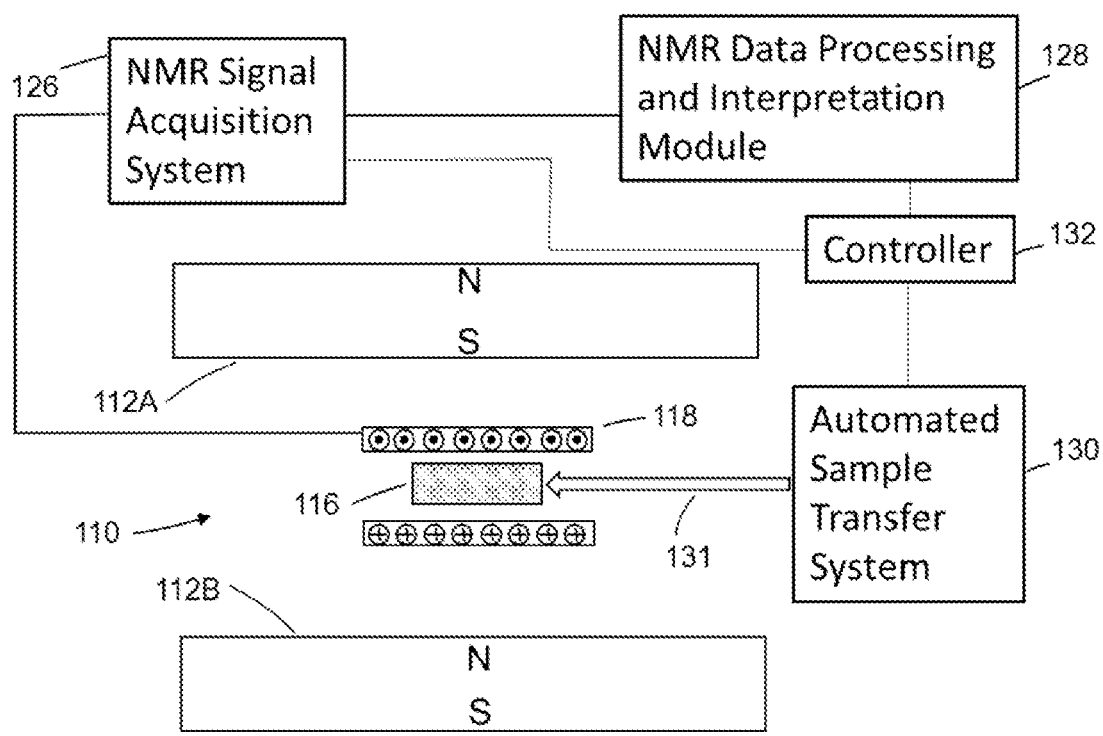

FIG. 1B depicts an embodiment of an automated version of NMR relaxometer. The automated version additionally comprises automated sample transfer system 130, an actuator 131 and a controller 132 that provides controls of the other systems and modules of the relaxometers (FIG. 1B). The sample transfer system 130 may comprise a cassette where a batch of sample is loaded, guides, motors and other mechanical and electromechanical means (not shown in FIG. 1B). The actuator 131 may be embodied as a retractable part (e.g. snail retractable, telescopic and others) to reduce the footprint of the relaxometer.

Figure 2A:
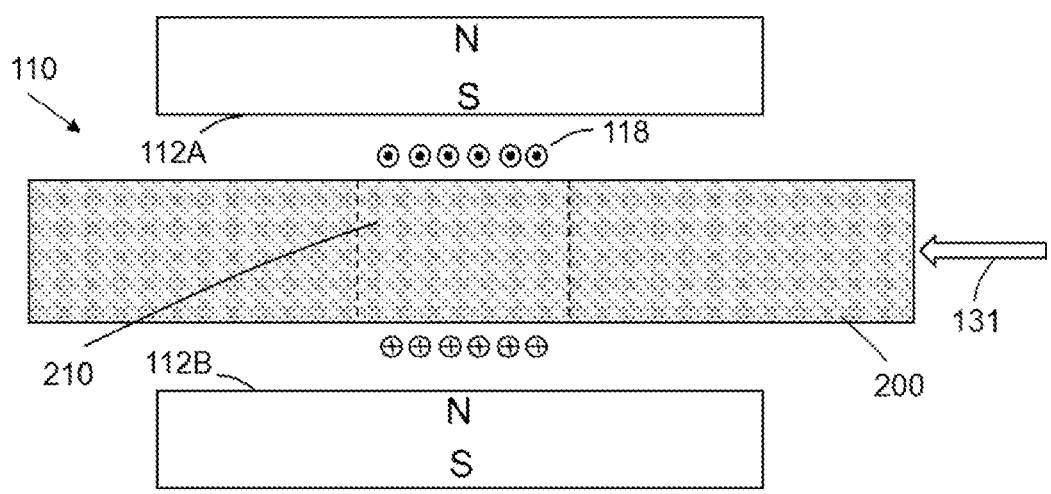
FIG. 2A, FIG. 2B and FIG. 2C show partial views of the low field NMR relaxometer illustrating three ways to define sensitivity volume for a long continuous sample or stack of samples.
Figure 2B:
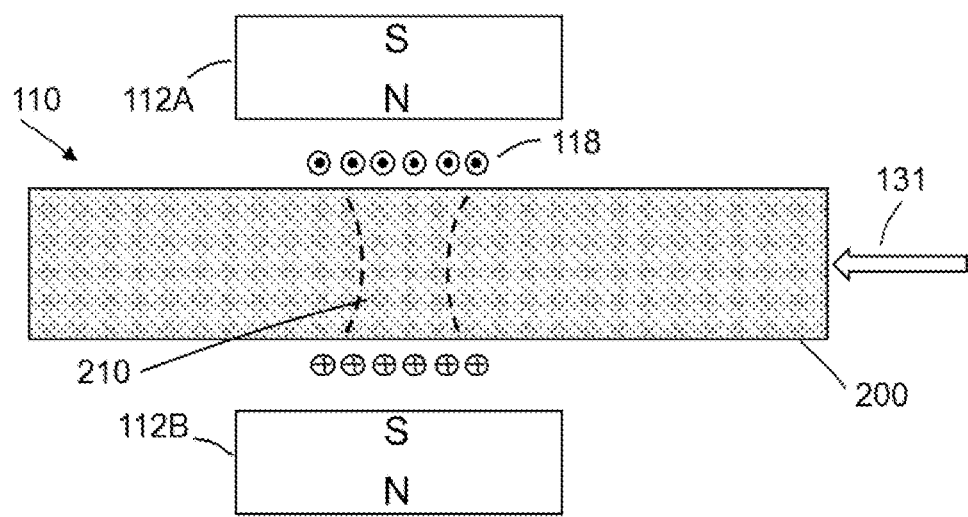
Figure 2C:
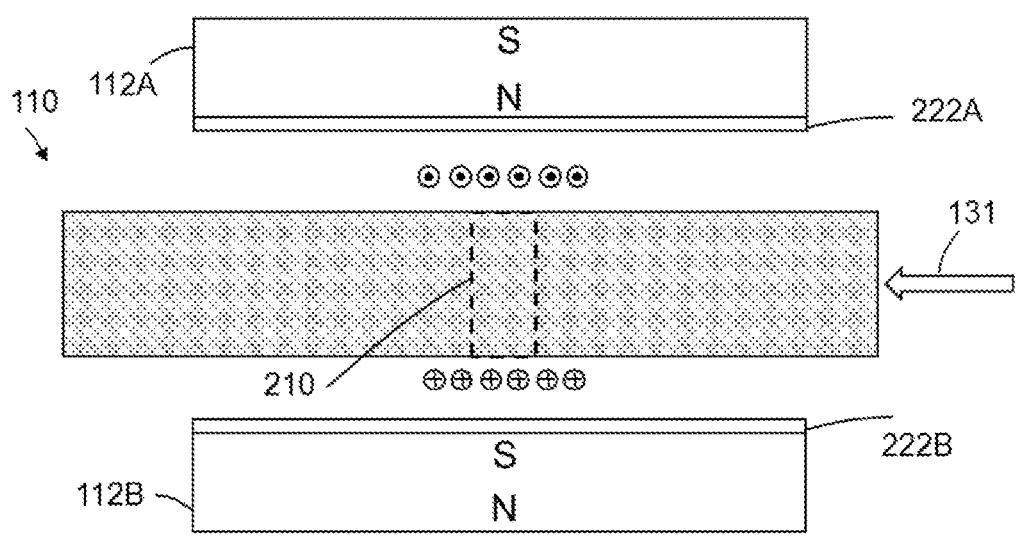

FIG. 2A, FIG. 2B, and FIG. 2C illustrate partial views (the sensor unit 110 in FIG. 1A and FIG. 1B) of the NMR relaxometer illustrating three ways to select a NMR sensitivity volume of a sample. The volume selection may be needed, for example, when a long continuous sample (e.g., a whole core) is scanned to produce a one-dimensional image of NMR relaxation properties of the core. In some cases, a volume selection may be used to define measurement volume in irregular shaped samples (e.g., individual or a stack of sidewall cores with irregular shaped ends). The volume selection may also be needed, for example, when a stack of closely spaced samples (e.g., sidewall rotary core samples) is placed in the NMR sensing area. In this case the volume selection is needed to avoid getting NMR signals from adjacent samples. The volume localization inside the sample may also be needed to avoid detection of an undesired signal from a hydrogen containing coating on the surface of the sample (the coating may be used as a moisture barrier). FIG. 2A illustrates an embodiment, in which the sensitivity volume 210 (the dashed lines show approximately the boundaries of the sensitivity volume) is selected by the RF magnetic field. The static magnetic field of the magnet assembly 112A, 112B is homogeneous over a long axial region. The longer homogeneity region of the static magnetic field may be required in order to ensure that the nuclei have enough time to get polarized in the static magnetic field during moving sample into the sensitivity area of the sensor unit). The axial extent of the sensitivity volume 210 is substantially determined by the RF magnetic field localization, which is approximately equal the axial extent of the NMR antenna 118 (the antenna aperture) or to the diameter of the NMR antenna, whichever is greater. The sample 200 may be axially transferred either manually or automatically.

FIG. 2B illustrates an embodiment, in which the sensitivity volume 210 (the dashed lines show the boundaries of the sensitivity volume) is selected by the static magnetic field of the magnet assembly 112A, 112B. The center of the sensitivity region is where a zero gradient point (a saddle point) is located. Due to inhomogeneity of the static magnetic field the magnetic field and therefore the excitation (Larmor) frequency change. Only the nuclei with the Larmor frequencies that are substantially within the frequency band of the RF magnetic field are excited. In case of a standard pulsed NMR excitation, (for example, when a CPMG excitation pulse sequence is used) the excitation frequency band is determined by the expression (1)

$$f_0 - \frac{1}{2 \cdot \tau_R} \le f \le f_0 + \frac{1}{2 \cdot \tau_R} \tag{1}$$

where $\tau_R$ is the pulse width of the refocusing RF pulse of the CPMG pulse sequence; $f_0$ is the Larmor frequency at the saddle point of the static magnetic field. The spatial region in which the Larmor frequencies satisfy the inequality (1) makes the sensitivity volume 210 (the boundaries of the sensitivity volume may look as the ones shown by the dashed lines in FIG. 2B). The radial extent of the sensitivity volume may be smaller than the radius of the sample 200. In this case the sensitivity area is located substantially inside the sample. This may be used to eliminate an undesired signal from a sample jar (having hydrogen containing walls) or hydrogen containing coating that may serve as a moisture barrier for the sample preservation (e.g., a paraffin wax). The radial and the axial extent of the sensitivity volume may be controlled by changing the width $\tau_R$ of RF magnetic field pulse. Therefore, radial and axial images can be performed by varying the pulse width of the RF pulse and moving the sample. The sensor unit according to the FIG. 2B preferably uses a relatively short, and, therefore, relatively light and inexpensive magnet assembly. The RF magnetic field in the sensitivity volume may or may not be homogeneous. In the latter case the sensitive volume is also affected by the RF magnetic field inhomogeneity. Both static and RF inhomogeneity may mimic the measurement conditions that are typical for downhole measurements. This may help when a combination of downhole NMR measurements and the surface NMR measurements on the borehole materials is used for the formation evaluation purposes. If the NMR measurements (e.g., on a sidewall core) are performed on a sample with a moisture barrier (e.g., a paraffin wax) that contains a conductive foil (typically, an aluminum foil), then the amplitude or/and the width of the RF pulses are adjusted to restore optimum NMR excitation conditions (preferably a 90° rotation of the nuclear magnetization during the excitation pulse of the CPMG pulse sequence and a 180° rotation of the nuclear magnetization during the refocusing pulse of the CPMG pulse sequence).

FIG. 2C illustrates an embodiment where the sensitivity volume is also selected by the static magnetic field inhomogeneity. Unlike for the case presented in FIG. 2B the static magnetic field in FIG. 2C has a substantially uniform axial gradient of the static magnetic field. The gradient may be produced by inserts 222A and 222B. In this case a radially uniform slice (sensitivity volume 210) is selected by the static magnetic field (the boundaries of the slice are shown by the dashed lines in FIG. 2C). The Larmor frequencies within the sensitivity volume also satisfy the inequality (1). The thickness Δy of the slice can be presented as (equation (2))

$$\Delta y \approx \frac{2\pi}{\tau_R} \cdot \frac{1}{\gamma \cdot G} \qquad (2)$$

where γ is the gyro-magnetic ratio for the nuclear spins (typically hydrogen nuclei for most of the cases of the earth formations evaluation purposes); G is the gradient of the static magnetic field. The thickness of the slice can be controlled by either changing the RF pulse width or by changing the gradient. An axial position of the slice may be controlled by changing the frequency of the RF pulse or by adding homogeneous magnetic field that can be also produced by the inserts 222A and 222B. The gradient static magnetic field and the additional static magnetic field may be produced, for example, by a set of coils driven by a direct current (DC) source. In addition, controlling the excitation slice thickness and position can be used to generate one dimensional (axial) image of the sample. A fast axial image can be used to find a sample boundary in case a stack of samples is used, especially when the axial extent of the samples is not well defined (e.g. side wall rotary cores having irregular shaped ends). As in the case presented in FIG. 2B the RF magnetic field in the sensitivity volume may not be homogeneous. In this case the sensitive volume is also affected by the RF magnetic field inhomogeneity. The volume selected using techniques presented in FIGS. 2A, 2B and 2C can be determined by conducting NMR measurement on a standard sample with known NMR signal per unit volume (e.g. on a water standard).

In case the sample includes liquids (e.g. a drill cuttings sample with drilling fluid, a micro-core sample with drilling fluid, a drilling fluid sample or other fluid samples) and the sample container is not fully filled with the borehole material the upper fraction of the sample may contain air which does not contribute to the NMR signal. Then a vertical gradient of the static magnetic field may be used to ensure the selected sensitive volume does not contain upper fraction of the sample.

Figure 3:
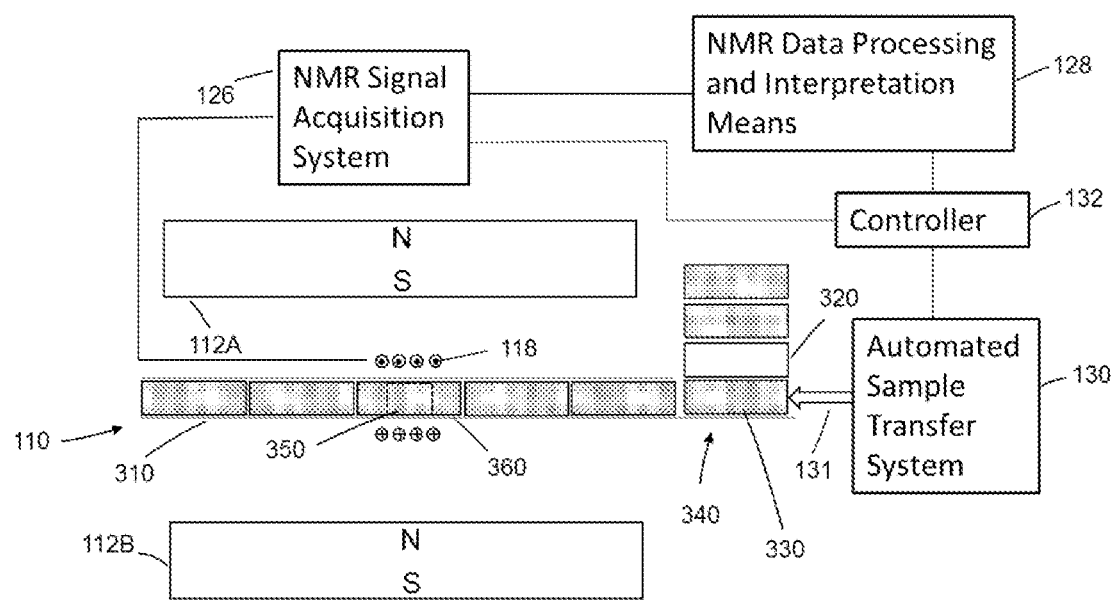
FIG. 3 represents an exemplary embodiment of the low field NMR relaxometer illustrating quasi-continuous sample feeding and the static magnetic field gradient assisted volume selection.

FIG. 3 illustrates an embodiment of the NMR relaxometer, in which a sequence of closely spaced samples (the first one is shown at 310) fed into the sensor area. This embodiment has advantage of higher throughput versus an individually transferred sample (FIG. 2) since positioning of the individual sample before one may start a measurement need to be slow enough to allow for the nuclear magnetization of the sample to establish its thermal equilibrium value. The time considered sufficient for the magnetization to establish its thermal equilibrium value (polarization time) is typically four times greater than the longitudinal relaxation time T1. Another advantage of the arrangement illustrated in FIG. 3 is that the actuator 131 needs to advance the stack of samples by a distance approximately equal to the length of a single sample container rather than by the distance approximately equal to axial dimension of the NMR sensing unit 110. Thus, the arrangement of FIG. 3 requires much smaller length of the actuator 131 and therefore reduces the footprint of the equipment, which may be critical for the on-site measurements. The set of samples loaded into the sample cassette may include an empty sample container 320 to assess a background signal (to be memorized and subtracted from the measurement data), a water standard 330 or a set of standards with different known relaxation times to calibrate the measurement data and the data inversion. The set may also include a standard sample with known T1/T2 ratio. Additionally, the set of samples may include a drilling fluid used to drill the oil well from where the borehole material is taken. The set of samples may also include a drilling fluid filtrate. The empty samples, the calibration standards, the drilling fluid and drilling fluid filtrate samples may also be used in case of non-automated system (e.g., the one presented in FIG. 1A) to increase accuracy of NMR surface logging data and to assist joint interpretation of surface and downhole NMR measurement. The automated NMR relaxometer of FIG. 3 comprises a sample cassette 340. The sample cassette may be arranged vertically to use gravity to assist the sample transfer as shown in FIG. 3 (at 340). It should be understood that other embodiments of the sample cassette may be used. For example, a tilted or zigzag type cassette, a horizontal cassette with spring assisted sample motion or a revolving circular cassette can be employed. The sensitive volume 350 of a sample 360 is preferably selected by a gradient of the static magnetic field or by a proper localization of the RF magnetic field to avoid NMR signal interference between adjacent samples.

Figure 4A:
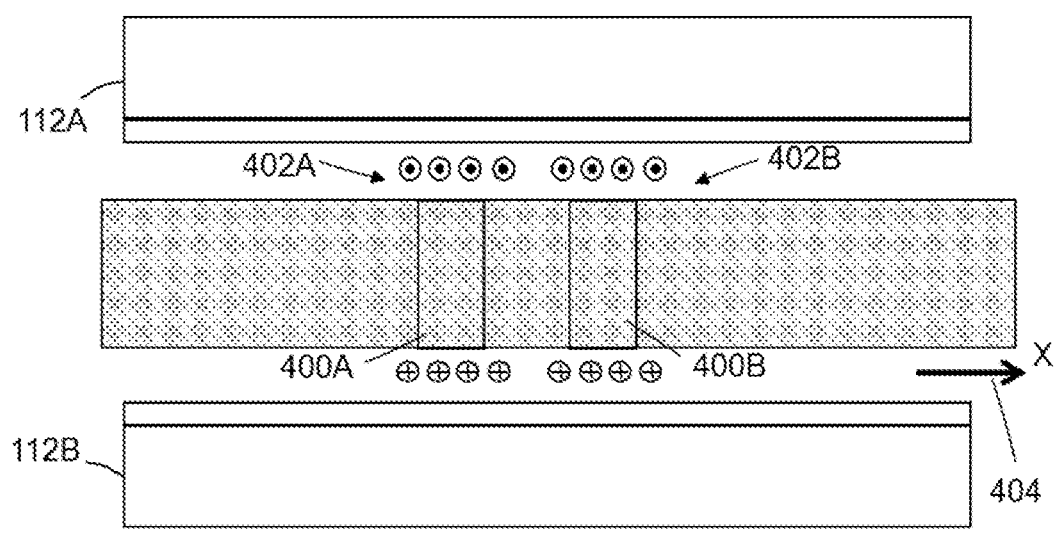
FIG. 4A, FIG. 4B and FIG. 4C illustrate embodiments of a low field NMR relaxometer with switching between at least two sensitive volumes to achieve higher throughput of measurements.
Figure 4B:
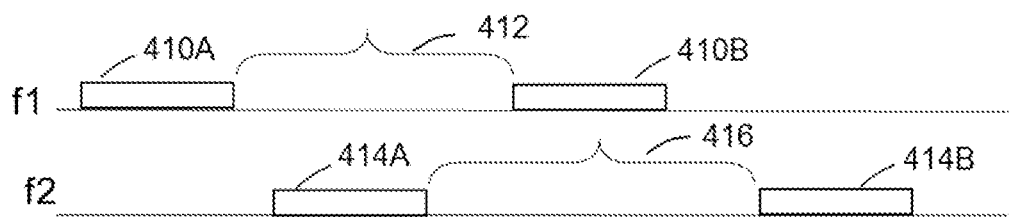
Figure 4C:
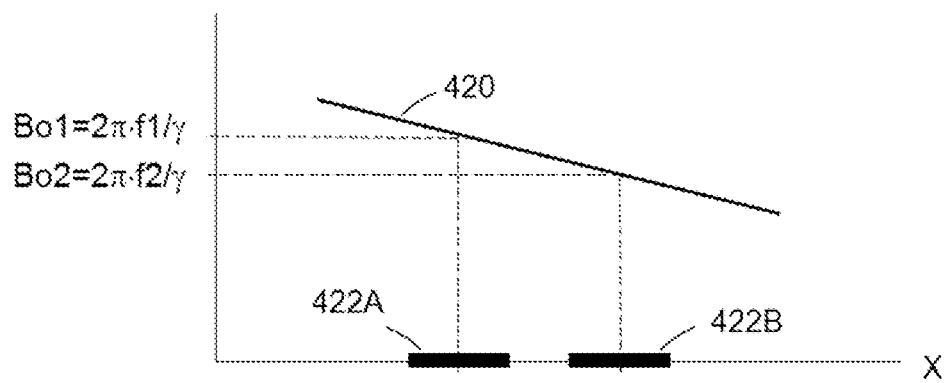

FIG. 4A, FIGS. 4B and 4C illustrate embodiments of a low field NMR relaxometer with switching between at least two sensitive volumes to achieve higher throughput of measurements.

FIG. 4A shows two sensitive volumes 400A and 400B that are selected sequentially. A standard transversal relaxation measurement NMR experiment comprises a sequence of RF pulses (CPMG sequence) followed by a waiting time needed for the nuclear magnetization to recover to its thermal equilibrium state. After the thermal equilibrium magnetization is reached (a waiting time of about four time the longest longitudinal relaxation time T1 is typically considered sufficient for the magnetization recovery) the experiment can be repeated. The repetition is typically done to increase signal-to-noise ratio (SNR) of measurement and to perform a phase cycling (a pair of CPMG pulse sequences with alternated phase of the excitation pulse is a simplest version of the phase cycling). The cycling can be used to remove outliers (e.g. constant offset and after-pulse ringing and other spurious signals) from the NMR relaxation signals. NMR excitation at the volume 400A is performed using antenna 402A. While nuclear magnetization in the sensitive volume 400A is recovered to reach its thermal equilibrium value the NMR experiment is performed at the second sensitive volume 400B using antenna 402A. The sensitive volume 400B can be an adjacent volume of a long continuous core or a part of the neighboring core sample in case a stack of closely placed core samples is analyzed. The volume selection may be done using a static field gradient as explained above in FIG. 2C. Then switching NMR excitation between the two volumes 400A and 400B may be done by changing operating frequency of the RF pulses: the operating frequency of the antenna 402A at a frequency f1 and the operating frequency of the antenna 402B at a frequency f2. The sensitive volume switching may be also done by changing the static magnetic field while switching the NMR signal acquisition between antenna 402A and antenna 402B without changing the operating frequency.

FIGS. 4B and 4C illustrate an embodiment, in which the switching NMR excitation between the volumes are done by changing the operating frequency of the RF pulses. The transversal relaxation measurement is performed using a CPMG pulse sequence. Then the first CPMG sequence 410A is run at the RF frequency f1 followed by the second CPMG sequence 414A run during the waiting time 412. Then the frequency return to f1 to run the second CPMG pulse sequence 410B at the same volume during the waiting time 416. This is followed by running the CPMG sequence 414B at the RF frequency f2 again. The train of the same frequency may be identical or have a phase alternation (phase cycling) as explained above. Changing the excitation volume when changing the RF operating frequency is illustrated in FIG. 4C showing the static magnetic field 420 as a function of axial distance x (shown at 404) of the sample. The change of the operating frequency f corresponds to the change of the static magnetic field Bo of NMR excitation according to the equation:

$$B_0 = \frac{2\pi \cdot f}{\gamma}. \tag{3}$$

(γ is the gyro-magnetic ratio of a nuclear). Therefore, due to the gradient of the static magnetic field the sensitive volume changes its position. The positions of the NMR excitation volumes corresponding to the frequencies f1 and f2 are shown at 422A and 422B respectively.

Thus, according to the technique illustrated in FIGS. 4A, 4B and 4C, the NMR relaxation measurements are done on two samples (or two adjacent areas of a sample in case of continuous core) during one measurement cycle (comprising CPMG sequence and waiting time). This doubles the measurement throughput. Since the CPMG train duration may be (typically) four times shorter than the waiting time, the throughput may be tripled and even quadrupled by using multiple sensitive volumes. However, multiple sensitive volumes will most likely require longer magnet, multiple antennas and cause additional complexity.

Figure 5:
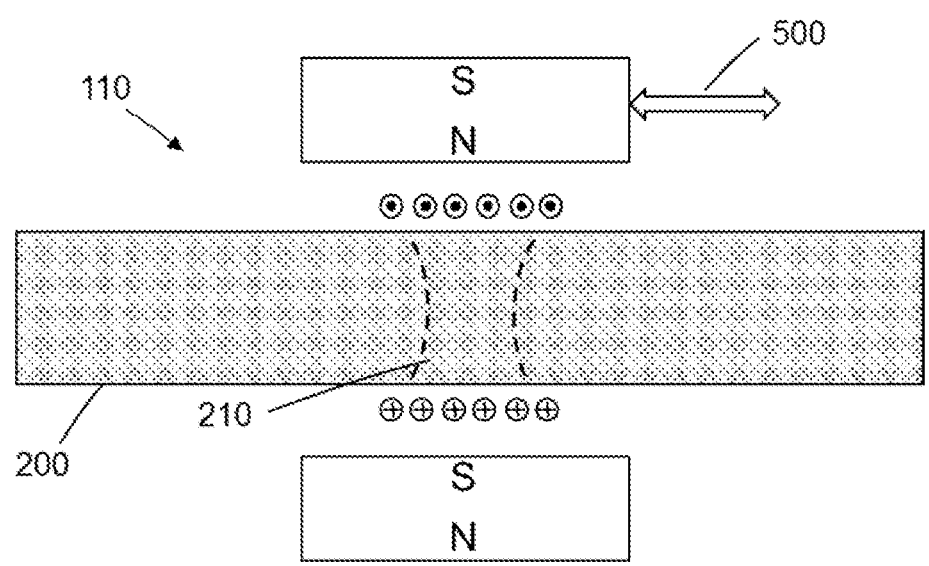
FIG. 5 illustrates another embodiment of a higher throughput measurement with switching between at least two sensitive volumes by moving sensor unit relative to the sample.

FIG. 5 illustrates another embodiment of a higher throughput measurement with switching between at least two sensitive volumes by moving sensor unit 110 relative to the sample 200. In many practical cases of NMR relaxation measurements, the waiting time is in the range of 5-20 s (corresponding maximum expected T1). This time is sufficient to mechanically move the sensor unit 110 using an actuator 500 and move the sensor unit back to continue measurement on the same volume as need (e.g. for data stacking to increase SNR). Alternatively, the sample 200 may be moved relative to the sensor unit using the same type of the actuator as the one used to transfer samples into the sensor area (e.g., the actuator shown at 131 in FIGS. 2A, 2B and 2C).

Mechanically moving the sample out of the RF antenna sensitivity area (e.g., for a shorter sample like a sidewall core or a core plug) during the waiting time between the consecutive RF pulse trains can be used to acquire a background signal (including spurious signals and a hydrogen signal from the sample jar) and then subtract it from the relaxation data. This way the background signal can be subtracted from both the free induction decay signal after the excitation pulse of the CPMG sequence and from the spin-echo signals after the refocusing RF pulses of the CPMG sequence.

Figure 6:
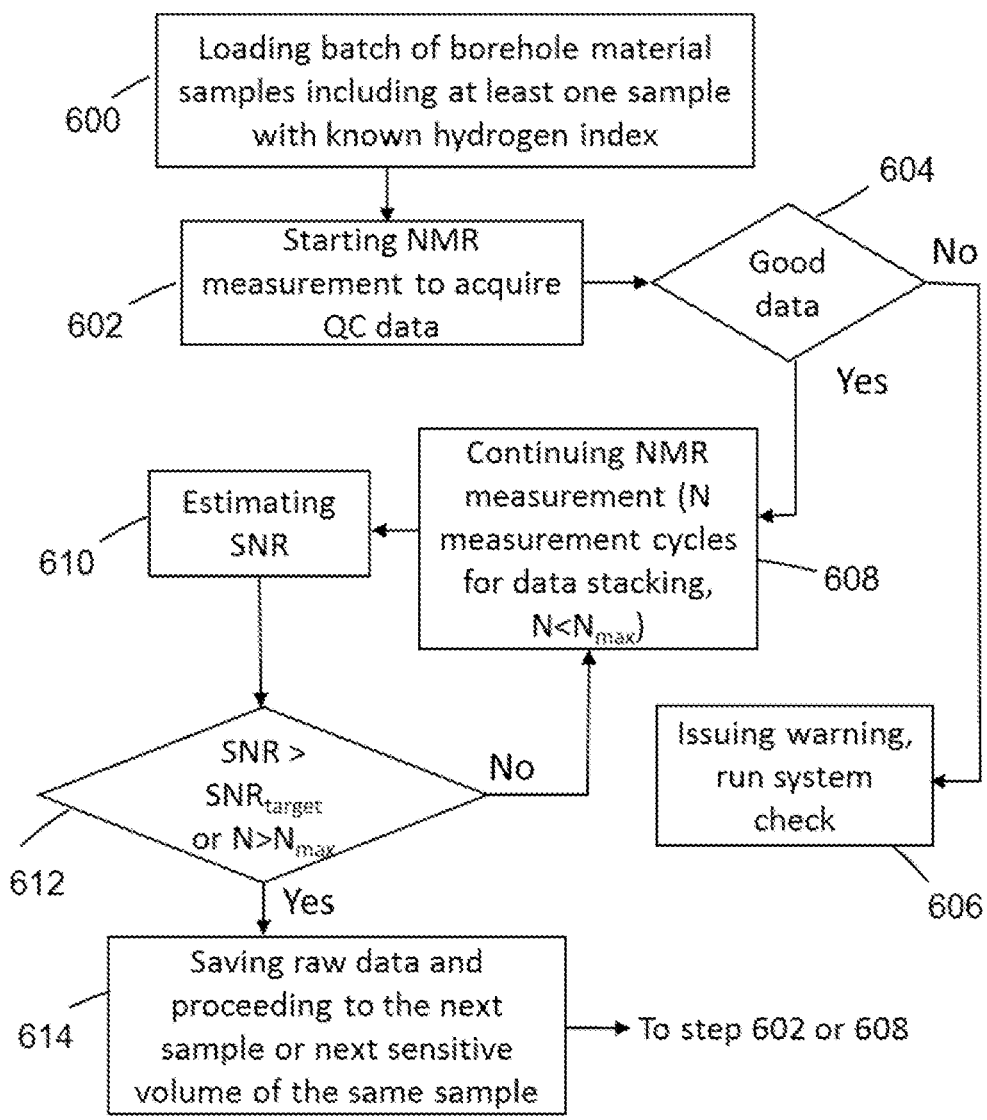
FIG. 6 illustrates a method of automated NMR data acquisition with adaptive data stacking.

FIG. 6 illustrates a method of automated NMR data acquisition with adaptive data stacking. The method comprises a step 600 of loading a batch of samples into a sample cassette with at least one sample having a known hydrogen index. This step may comprise one of the following: loading a water sample (to be used for on-the-fly calibration), an empty sample container (to measure and then subtract a background signal), a sample with known T1/T2 ratio and a sample of a drilling fluid (e.g. in case the batch of samples is the drill cuttings samples). The method further includes the step 602 of acquiring quality control (QC) data to provide an initial characterization of data quality (the step may include detecting a tuning error, electromagnetic interference, a systematic error and other indications of malfunctioning of the measurement system). The method may include a step 604 of analyzing the QC data and making decision on whether to run a comprehensive system check 606. If the QC data look satisfactory, then the standard measurements using a predetermined NMR measurement sequence (e.g. a transversal relaxation measurement sequence like CPMG or/and a combination of CPMG sequences allowing for measuring both T1 and T2 NMR relaxation times) is run (step 608 in FIG. 6). The SNR of the NMR data is then measured (step 610) and a decision is made (step 612) based on comparison of the SNR with the targeted value $SNR_{target}$ whether or not to continue repeating the experiment (step 608) for stacking the data to increase SNR (adaptive stacking). When the targeted $SNR_{target}$ is achieved or the maximum number of repeats on one sample $N_{max}$ is reached the sample measurement data are saved (step 614) and the next sample (next sample volume) is transferred to the sensitive area of the sensor unit to automatically conduct measurements on the next sample with or without repeating the steps 602, 604 and 606. The step 608 may include an on-the-fly frequency tuning and system gain measurement. The tuning and the gain measurement may be needed to increase accuracy of measurements when the measurements are run automatically for a long period of time in presence of possible thermal or other instabilities of the magnetic field of the magnet and the electronic components of the NMR signal acquisition system. The method of FIG. 6 may additionally include at least one of the following automated measurements (not shown in FIG. 6): the sample weight, the sample bulk density, and the sample volume measurements needed for the NMR data normalization.

Figure 7:
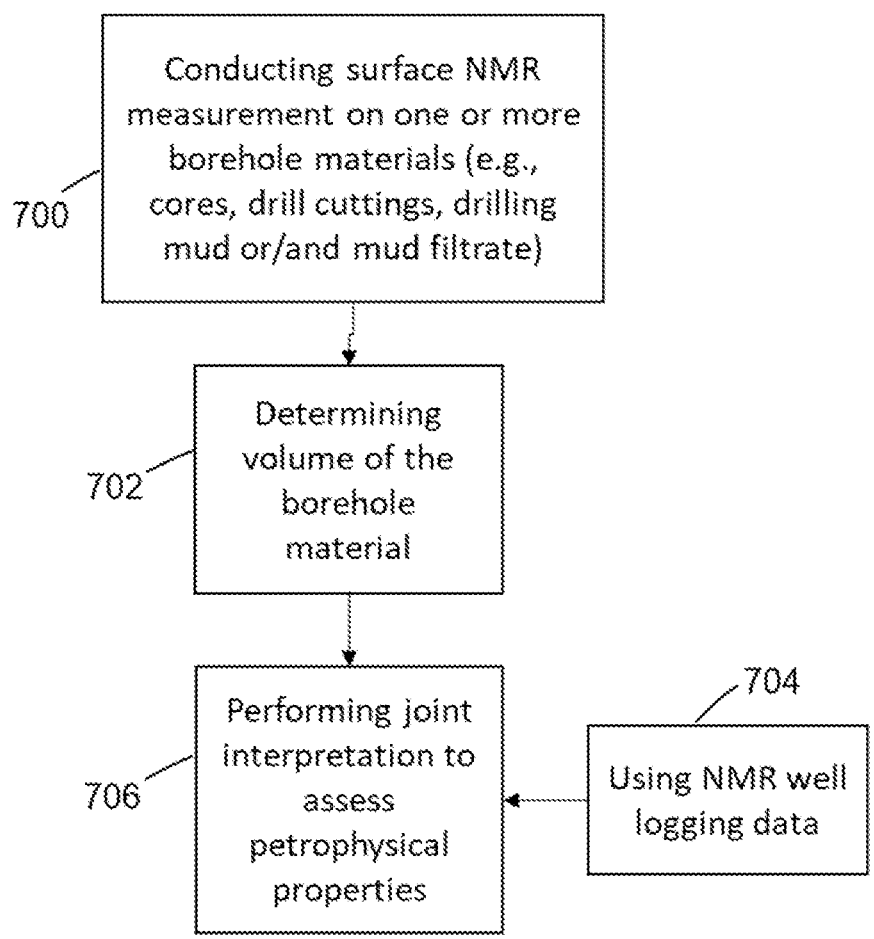
FIG. 7 illustrates a method of using surface NMR data in combination with downhole measurement data.

FIG. 7 illustrates a method of using surface NMR data in combination with downhole measurement data. The method comprises a step 700 of surface NMR measurement on a borehole material (including, for example, whole cores, sidewall cores, drill cuttings, drilling fluid or drilling fluid filtrate). The surface NMR measurements are preferably performed as high throughput automated measurements that reduce operation cost and increase reliability of measurements. The method of FIG. 7 further comprises a step 702 of the sample volume measurement. The sample volume is required to normalize the surface NMR data and calibrate the NMR signal in porosity units to compare the surface NMR data with the downhole NMR data in the same units. The surface NMR measurement are preferably conducted at a well site and may be compatible with a wireline well logging truck. In case of the surface NMR measurement on sidewall cores the cores may have irregular shaped ends, which makes it a challenge to perform a fast-automated measurement of the volume. In this case the volume measurement may be replaced by defining (selecting) the volume using a gradient static magnetic field or a localized RF magnetic field or both as explained above (FIGS. 2A, 2B and 2C). A controllable volume selection in the central area of the sample makes it insensitive to the irregular (unknown) volume near the ends. Alternatively, the volume can be measured by measuring weight of the sample and its bulk density (e.g. using gamma ray densitometry).

The method of FIG. 7 further comprises using downhole NMR data (step 704) and performing a joint interpretation (step 706) of the downhole NMR data and the surface NMR measurement data (e.g. acquired on sidewall cores). The joint interpretation may include comparison of in-situ (downhole) concentration of different fluids and residual fluids concentration in core samples based on comparison of (i) intensity of specific components of the transversal NMR relaxation spectrum acquired from calibrated surface NMR measurement and (ii) calibrated downhole NMR measurements. The comparison may provide information about relative producibility of these fluids to allow for a quick assessment of producibility of hydrocarbons residing in different parts of porosity system of the earth formations.

The joint interpretation may further include determining the hydrogen index of the drilling fluid filtrate (measured in step 700) by comparing the NMR signal from a known volume of the drilling fluid filtrate with the NMR signal of a water standard (of known volume) then using the hydrogen index data to determine porosity of the rock formations based on the downhole NMR measurement.

The step of joint interpretation may also include using surface resistivity data acquired on a borehole material sample. The resistivity measurement may be a byproduct of the NMR measurements. The NMR measurements typically use a system gain measurement implemented by injecting a known RF signal into the NMR antenna and acquiring the response at the NMR receiver output. The response is indicative of the NMR antenna coil quality factor. It would be readily understood by those skilled in the art that the antenna quality factor is closely related to the resistivity of the sample to be analyzed. The resistivity measurements accompanying the NMR measurement along with other measurements on the borehole materials (e.g., a natural gamma spectroscopy) may be also used for joint interpretation of the surface data (without the downhole data, e.g., in case the downhole data are not available).

NMR relaxation measurements acquired using the surface NMR equipment (e.g. the apparatus presented in FIGS. 1A, 1B and FIG. 3) typically have better relaxation spectrum resolution than the downhole NMR measurements (and higher SNR too). To take advantage of the higher quality surface NMR measurements the joint interpretation may include using fast transversal relaxation components acquired from surface NMR measurements in combination with the relaxation spectrum acquired downhole, in which the faster part of the transversal relaxation spectrum may not be accessible.

One of the borehole material types used in the surface measurement of the method of FIG. 7 may be drill cuttings. Although a part of the porous structure of the drill cuttings may be damaged by the drill bit (e.g. large pores may be partly destroyed) the fluids in small pores and fluids bound to the surface of the pores (e.g., clay bound water) remain preserved and carry valuable information about the residual fluid saturation, fluids in nano-pores, wettability and permeability of the rock formations. Corresponding to these fluids is the fast fraction of the NMR transversal relaxation spectrum that can be separated from the slower part of the relaxation spectrum corresponding to the drilling fluid filling the space between the drill cuttings pieces.

The downhole NMR measurements may be either wireline measurement or measurement while drilling. Both surface and downhole NMR measurement can be accompanied by other surface and/or downhole measurements, e.g. natural gamma ray measurements. The joint interpretation may include using NMR and non-NMR measurements. For example, the natural gamma measurements in combination with averaged spectrum of the surface natural gamma spectroscopy may provide the drill cuttings depth matching information. The NMR measurements on the drill cuttings may assist with determining the volume of the drill cuttings or other irregular shaped borehole materials.

Fast measurement of the volume of a borehole material (e.g. drill cuttings or micro-cores) is a necessary element of a high throughput borehole material characterization (e.g. via NMR or natural gamma spectroscopy) needed to support a drilling process. Indeed, the measurement time needs to be adequate to the drilling rate of penetration (ROP). For example, the rate 100 ft/h with a desired spatial resolution of 5 feet (one sample per five feet of drilling) would require the total measurement time, including the sample volume measurement, of less than 3 min per sample.

Figure 8:
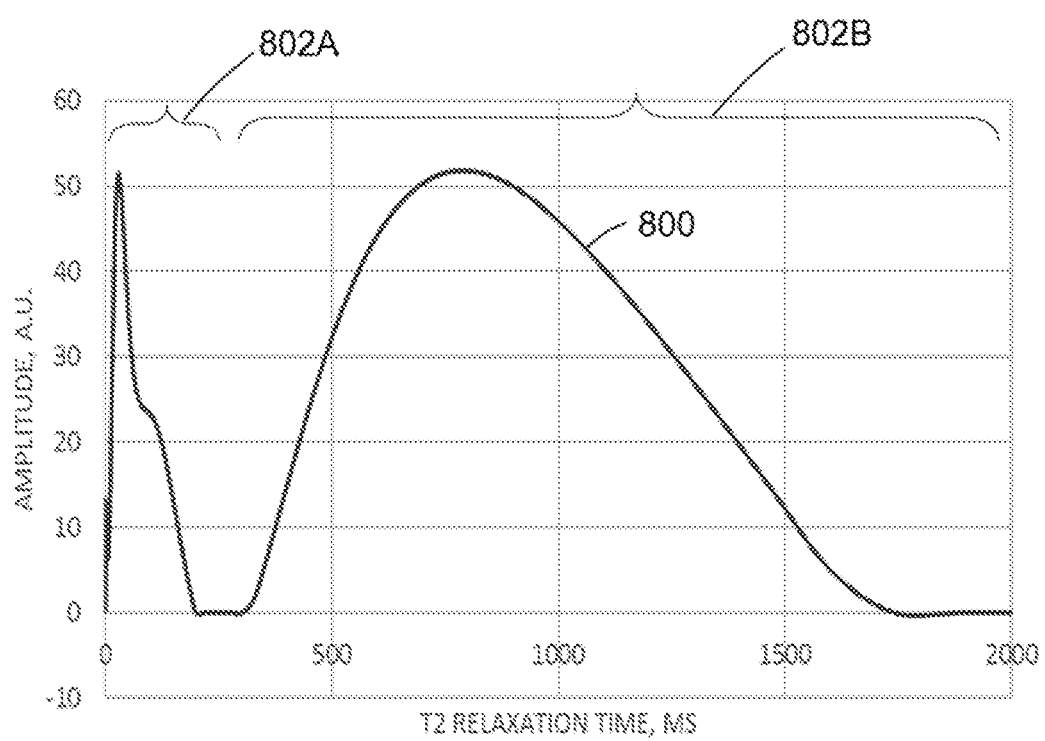
FIG. 8 illustrates a method of volume measurement for irregular shaped samples.

FIG. 8 illustrates a method of volume measurement of borehole materials containing irregular shaped pieces of rock like drill cuttings or micro-cores. Presented in FIG. 8 is an exemplary distribution 800 of the transversal relaxation times in a drill cuttings sample with the drilling fluid filling the space between the cuttings pieces. The faster fraction 802A of the relaxation times distribution corresponds to the fluids inside the pores of the cuttings pieces. It characterizes the type of fluids and the wettability of the pore surface in a preserved fraction of the porous space. The slow relaxation fraction 802B represents the drilling fluid filling the space between the cuttings pieces. If the sample container is filled completely with the cuttings and the drilling fluid, then the volume of the cuttings present in the sample can be calculated by subtracting the total volume of fluids in the sample from the volume of the sample container. The total volume of fluid can be determined via calibrated NMR measurement: the volume is proportional to the total area under the NMR relaxation curve 800. Then the following equation can be used to calculate the volume of the rock presented in the sample $$V_{cuttings} = V_{container} - \frac{S_{sample}}{S_{fluid\_sample}} \cdot V_{fluid\_sample} \quad (4)$$

In the equation (4): $V_{cuttings}$ is the volume of cuttings, $V_{container}$ is the volume of the sample container, $S_{sample}$ is the area under the transversal relaxation distribution curve 800 proportional to total amount of fluids in the sample, $S_{fluid\_sample}$ is the area under the transversal relaxation time distribution curve measured on the drilling fluid sample and $V_{fluid\_sample}$ is the volume of the drilling fluid sample (preferably the same as the volume V container of the sample container).

It is beneficial in some cases to determine the weight of the cuttings. The weight can be calculated as $$W_{cuttings} = W_{total} - \frac{S_{sample}}{S_{fluid_{sample}}} \cdot V_{fluid_{sample}} \cdot \rho_{fluid}, \quad (5)$$

where $W_{total}$ is the total weight of the sample and $\rho_{fluid}$ is the density of the drilling fluid.

The volume and the weight of the cuttings may be used to normalize the NMR data and non-NMR data. For example, it can be used to normalize the natural gamma spectroscopy data (e.g. K, U, Th signals that can be related to the rock type). The natural gamma spectroscopy may require measurement of the K, U, Th background signals present in the drilling fluid sample and further subtraction of a fraction of these signals corresponding to the volume of the drilling fluid in the cuttings sample from the K, U, Th signals acquired on the cuttings sample.

NMR data related to the cuttings structure correspond to the faster fraction 802A of the relaxation time distribution. The combined NMR and natural gamma spectroscopy data on cuttings (and micro-cores) can be used to assess petrophysical parameters related to lithology, pore structure and intra-pore fluids properties of rock formations.

Based on the equations (4) and (5) the density of the drill cuttings ($W_{cuttings}/V_{cuttings}$) may be assessed giving additional information about the rock type.

Figure 9:
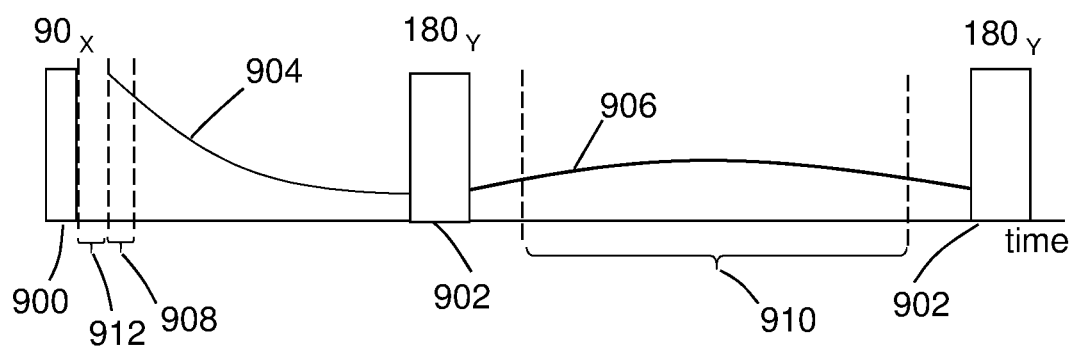
FIG. 9 illustrates an embodiment of the RF pulse sequence with the corresponding nuclear magnetization signals.

Another aspect of the present invention is a method of acquiring fast relaxation components of the NMR relaxation using free induction decay (FID) signal after the excitation 90° pulse of the CPMG measurement sequence. FIG. 9 illustrates an embodiment of the RF pulse sequence with the corresponding magnetization signal including the FID and the spin echoes. Shown in FIG. 9 is the excitation pulse 900, two refocusing pulses 902, FID 904 and the first spin echo 906 of a plurality of spin echoes that are typically generated by a plurality of 180° refocusing RF pulses typically used in a CPMG pulse sequence. Also shown in FIG. 9 are the signal acquisition windows 908 (for the FID) and 910 (for the spin echo). The signal is typically integrated in the acquisition window to obtain one data point per an acquisition window. The FIG. 9 also shows a dead-time interval 912 required to suppress spurious signals after the excitation RF pulse in order to start the signal acquisition. The dead time limits the time to the first echo (typically the same as the distance between consecutive echoes). The shortest time-to-echo (TE) in the low-field NMR relaxometry is typically about 0.1 ms. A standard CPMG sequence is used to acquire the spin-echo signal only and therefore the relaxation components with up to about 0.3 ms relaxation times are substantially lost. A properly acquired at least one point on the FID (as shown in FIG. 9) can significantly improve sensitivity to the fast relaxation components.

The RF pulse sequence of FIG. 9 is a CPMG sequence that may be repeated with a constant waiting times (recovery times) to employ phase alternation (typically used to remove spurious signal from the NMR relaxation data) or/and implement a data stacking to increase signal-to-noise ratio. A plurality of the CPMG trains can be also run with a variable waiting time between the trains giving a set of data needed to determine a two-dimensional T1-T2 distribution of the relaxation times. Yet another example of the NMR measurement sequence that can be used to acquire transversal relaxation data is presented in U.S. Pat. No. 5,566,274.

Figure 10:
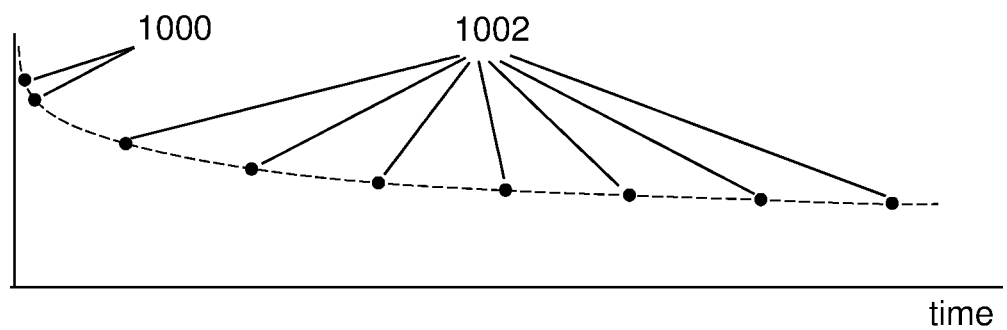
FIG. 10 shows an example of the NMR relaxation curve with the first two points obtained from a free induction decay signal.

FIG. 10 shows an exemplary NMR relaxation curve with the first two points (representing fast transversal relaxation components) obtained from free induction decay (FID) signal (points 1000). These points of the relaxation curve would be lost without the FID acquisition due to the insufficiently short time-to-echo (TE). The rest of the points on the transversal relaxation curve (points 1002) presented in FIG. 10 are obtained from the spin echo signals (a standard way of acquiring the transversal relaxation curve). To match the scales of the FID data and the spin echo data a proper calibration procedure needs to be employed.

A calibration sample can be used to match (to stitch) the FID data with the spin-echo data to obtain a T2 relaxation curve with faster relaxation components (not obtainable from the spin-echo data alone). The calibration sample should preferably have a known T2 relaxation property with preferably long (much longer than TE), single exponential relaxation. The calibration process may include acquiring the following data: FID samples $f_i^{(c)}$ in calibration mode (at least one sample point), samples $r_{fi}^{(c)}$ of spurious signals (e.g., spurious ringing) after the excitation pulse in calibration mode and the CPMG echo signals $e_j^{(c)}$ in calibration mode (one data point per echo). The calibration process further includes calculating the vector of coefficients $C_{fi}$ for the FID data $f_i^{(c)}$ in calibration mode and the vector of coefficients $C_{ej}$ for the echo data $e_j^{(c)}$ in calibration mode. The vectors are calculated as follows:

$$C_{fi} = \frac{E}{f_i^{(c)} - r_{fi}^{(c)}}, \, C_{fi} = C_f(t_i), \, i = 1, 2, \ldots I, \quad (6)$$

where E is calculated as an exponential fit of the echo data $e_j^{(c)}$ with extrapolation to zero time, $r_{fi}^{(c)}$ is the spurious signal (ringing) after the excitation RF pulse. The vector of coefficients $C_{ej}$ is defined as $$C_{ej} = \frac{E}{e_j^{(c)}}, \, C_{ej} = C_e(t_j), \, j = 1, 2, \ldots J, \quad (7)$$

The equation (7) is written in the assumption that the echo signals does not include the spurious signals because the spurious signal are typically eliminated from the spin echo data by using a CPMG pulse sequence with phase alternated excitation pulses. Using the coefficients (6) and (7) the corrected constituents (the FID and the echo data) of the relaxation data set can be presented as $$f_{corr\,i} = C_{fi} \cdot (f_i - r_{fi}) \quad (8)$$

$$e_{corr\,j} = C_{ej} \cdot e_j. \quad (9)$$

Then the relaxation data with extension to the faster relaxation region can be presented as $$s_k = s(t_k) = [f_{corr1}, f_{corr2}, \ldots f_{corrI}, e_{corr1}, e_{corr2}, \ldots e_{corrJ}], \text{ with } k=1,2,\ldots,I+J. \quad (10)$$

The corresponding vector of times is $$t_k = [0, t_1, t_2, t_{I+J}]. \quad (11)$$

If the calibration sample is a water sample (hydrogen index is equal to 1) then the relaxation data can be presented in porosity units (p.u.):

$$s_{p.u.} = \frac{V_{w\_sample}}{V_{sample}} \cdot \frac{s}{E}. \quad (12)$$

Here are the volume of the calibration sample and the borehole material sample to be analyzed respectively.

Figure 11:
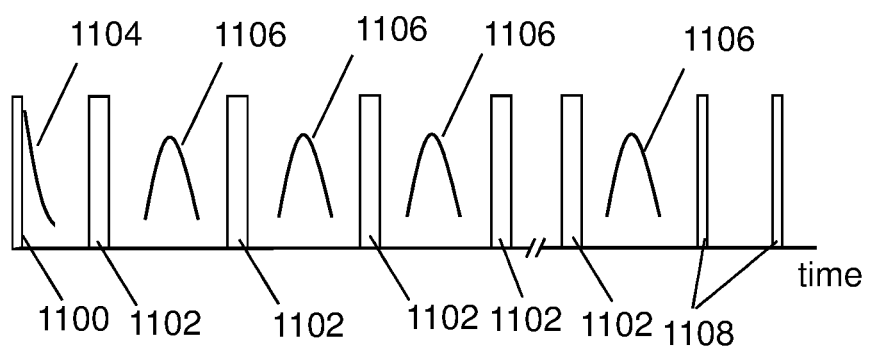
FIG. 11 illustrates a method to substantially eliminate the spurious signals after the excitation RF pulse.

As explained above the spurious signals interfering with the acquisition of the echo signals can be removed by using phase alternation of the excitation pulses in two consecutive CPMG trains (a simple version of the phase cycling). The alternation inverts the spin echoes and do not affect the spurious signals from the refocusing pulses. Therefore, subtracting the echo signals of two consecutive echo trains substantially eliminates the spurious signals. Unlike acquiring the spin-echo signals the FID phase follows the phase of the excitation pulse. Therefore, the alternation can not be used to eliminate the spurious signals (e.g., the spurious ringing) after the excitation pulse. FIG. 11 illustrates a method to substantially eliminate the spurious signals after the excitation RF pulse. Shown in FIG. 8 is a standard CPMG sequence of RF pulses 1100, 1102 and corresponding echoes 1106. One or more auxiliary pulses 1108 identical to the excitation pulse 1100 are used to acquire the spurious signals (spurious ringing) data. Since right after the CPMG sequence the longitudinal component of the nuclear magnetization (the component in the direction of the static magnetic field) is substantially zero, then, unlike the FID 1104 after the excitation pulse 1100, there is no nuclear magnetization signal (substantially no FID) after the auxiliary pulse (only the spurious signals). This way the spurious signals $r_{fi}^{(c)}$ can be acquired and then subtracted from the relaxation data as explained above (equations 6, 8). A plurality of short spaced auxiliary pulses can be used to stack the spurious signals from the auxiliary pulses and therefore acquire spurious signals with better SNR.

In one embodiment the spin-echo and the FID signals may be acquired using different (separate) sequences. When acquiring the echo signals the FID signal after the excitation pulse of the CPMG sequence is typically not acquired. In this case, by not having the acquisition window needed to acquire the FID after the excitation pulse, an undesired additional delay to the first refocusing RF pulse and therefore increase in the time-to-echo (TE) of the CPMG train can be avoided. The separate sequence may comprise an at least one excitation pulses followed by the corresponding FID (preferably the separate sequence comprises a plurality of the excitation pulses and FIDs to increase signal-to-noise ratio). Alternatively, the separate sequence used to acquire an FID signal may comprise an at least one CPMG sequence with TE longer than the TE of the sequence used to acquire the spin-echo signals (preferably the separate sequence comprises a plurality CPMG sequences to increase signal-to-noise ratio).

The shape of the FID signal and the echo signal measured on the calibration sample is typically determined by an inhomogeneity of the static magnetic field in the sample. If the FID signal decay during the time delay between the excitation pulse and the first refocusing pulse of the CPMG sequence is significant or/and the echo signal change during the acquisition window is significant, then the calibration sample should preferably be selected to have the shape/size close to the shape/size of the core sample. This is preferably done to minimize the calibration error.

As an alternative to using the auxiliary excitation pulses after the CPMG train to eliminate a background signal (the background signal may include spurious signals, e.g. a spurious ringing, as well as voltage offset in receiver electronics and other artifacts), a nuclear magnetization inverting RF pulse can be used before the excitation pulse. The inverting RF pulse may be the same as the refocusing RF pulse (often called as 180° rotation pulse) in the CPMG sequence. The FID signal after the excitation pulse preceded by the inverting RF pulse and the FID signal without of the inverting pulse have opposite phases while the main constituents of the background signal (e.g. a spurious signal) are substantially the same. Acquiring an at least two FID signals, one with and the other without the magnetization inverting RF pulse and then subtracting the FID signals give an elimination of the background signal (while producing a sum of the two FID signals).

Another embodiment of a method to eliminate the spurious signals (e.g., ringing or voltage offset in receiver electronics) interfering with the FID signal can be based on acquiring voltage after the excitation pulse (or/and after the refocusing pulses) with and without the sample in the sensitivity volume. This may be done as explained above in FIG. 5. The method can be implemented as separate set of measurements or during waiting time while waiting for the magnetization recovery after a CPMG pulse sequence or after an FID (if acquired separately from the CPMG train). The same can be used in acquiring the spin-echo signals, especially when the undesired spurious signal in the spin echo acquisition window comes, at least partly, from the excitation pulse.

Figure 12A:
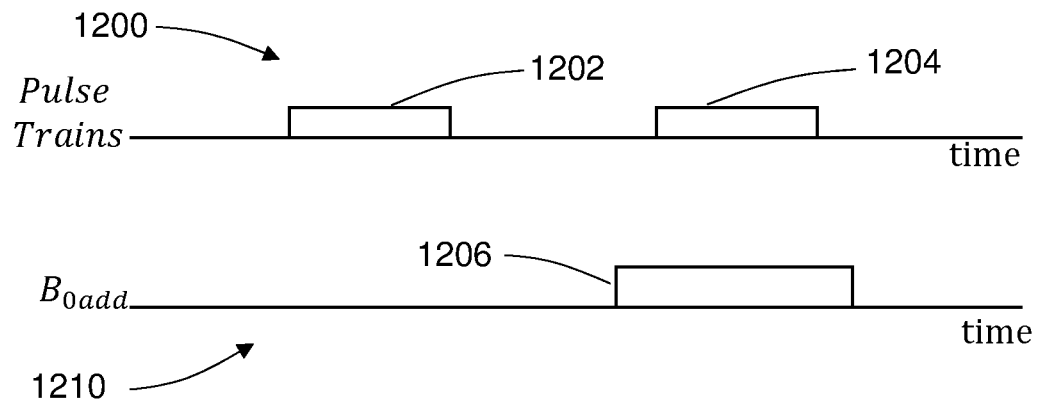
FIG. 12A and FIG. 12B shows an example of the static magnetic field distribution and an additional static magnetic field used to acquire and substantially eliminate the background signal (the spurious signals).
Figure 12B:
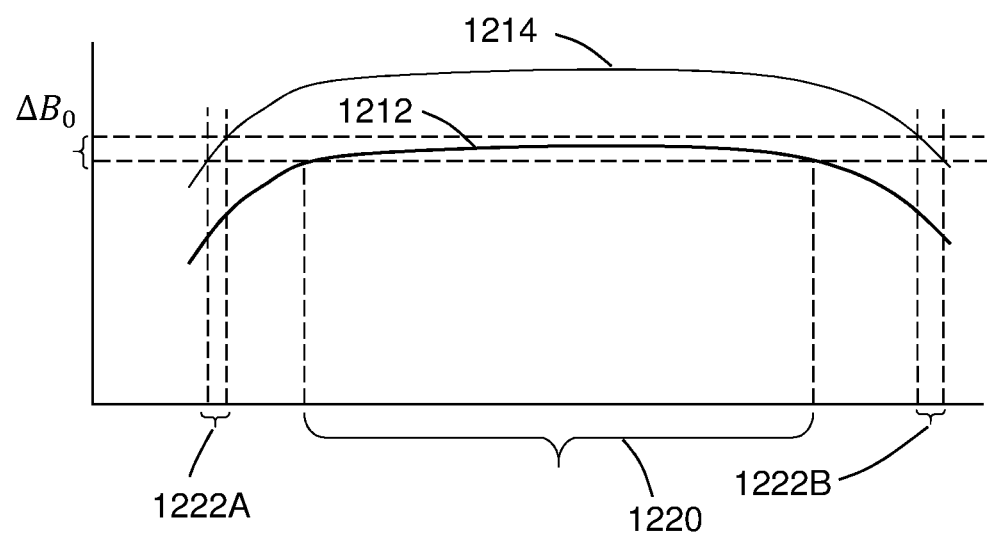

Yet another embodiment of a method to eliminate the background signal is illustrated in FIG. 12A and FIG. 12B. According to the illustrative embodiment presented in FIG. 12A and FIG. 12B an additional (auxiliary) magnetic field is used to substantially spoil (eliminate) the NMR excitation volume in the sample to be analyzed. FIG. 12A shows a time diagram of the RF pulse sequence 1200 (there can be a plurality of repeating sequences to gain signal-to-noise ratio), which may comprise at least two fragments 1202, 1204. FIG. 12A also shows a time diagram of the additional static magnetic field 1206. The RF sequence fragment 1202 corresponding to no additional static magnetic field is used to acquire the total detected signal including the NMR signal and the background signal. The RF sequence fragment 1204 corresponds to the additional static magnetic field applied. The sequence 1204 is used to acquire the background signal. Each of the RF sequence fragments 1202 and 1204 may comprise an at least one excitation pulse (to produce a FID) or an at least one CPMG pulse sequence (to produce a FID signal and a plurality of spin-echo signals). The time interval between the sequences 1202 and 1204 may include a waiting time (preferably at least four times the longest expected longitudinal relaxation time of the hydrogen signal in the sample) required to recover the thermal equilibrium nuclear magnetization. The fragment (sequence) 1202 may have a waiting time between the excitation pulses or CPMG pulse sequences included in 1202 to recover the nuclear magnetization in the sample; in this case the acquiring of the background signal or/and the calibration signal may be performed during the waiting time to increase the measurement throughput. Using the additional static magnetic field is illustrated in FIG. 12B. A spatial distribution (e.g. an axial distribution) of the static magnetic field is shown at 1212. For the static magnetic field distribution 1212 a static magnetic field range $\Delta B_0=2\pi/(\gamma \cdot \tau_R)$ (determined by the bandwidth of the refocusing RF pulse) defines a spatial region 1220, in which the NMR excitation is possible (a potential sensitivity region). The size of the potential sensitivity region, the RF pulse width (inversely proportional the bandwidth of the RF pulse) and the effective area of sensitivity of the NMR antenna (related to the antenna dimensions) define a NMR sensitivity volume where the sample to be analyzed is placed. When the additional static magnetic field is applied the spatial region changes the size/shape and position as shown at 1222A and 1222B (split into two fragments). If the sample is positioned inside the region 1220, then the new position 1222A, 1222B is beyond the sample area and therefore the only signal acquired is the background signal (present with no sample in the sensitivity area). Therefore, the background signal can be acquired and then the background data subtracted from the total signal data to obtain the NMR relaxation data from the sample only. In case of a long sample the new position 1222A, 1222B is not beyond the sample. However, selecting the antenna size and the additional static magnetic field distribution in a way that the position 1222A, 1222B is substantially beyond the effective area of sensitivity of the antenna, the NMR sensitivity volume in the sample is substantially eliminated. Therefore, a substantially zero NMR signal from the sample can be achieved to acquire the background signal only. Thus, the background signal can be acquired and then the background data subtracted from the total signal data to obtain NMR relaxation data from the sample. Since acquiring the background signal may not require waiting for the nuclear magnetization to recover its thermal equilibrium state the sequence fragment 1204 may comprise a plurality of repeating excitation pulses (or a plurality of CPMG sequences) with fast repetition rate. Then stacking the signals detected after the excitation pulses (or/and signals detected after refocusing pulses) during the sequence 1204 will substantially eliminate an additional noise that otherwise may be introduced when subtracting the background data from the total signal data to obtain NMR relaxation data from the sample to be analyzed.

A source of the additional static magnetic may be a coil or a set of coils driven by a switchable direct current.

Figure 13:
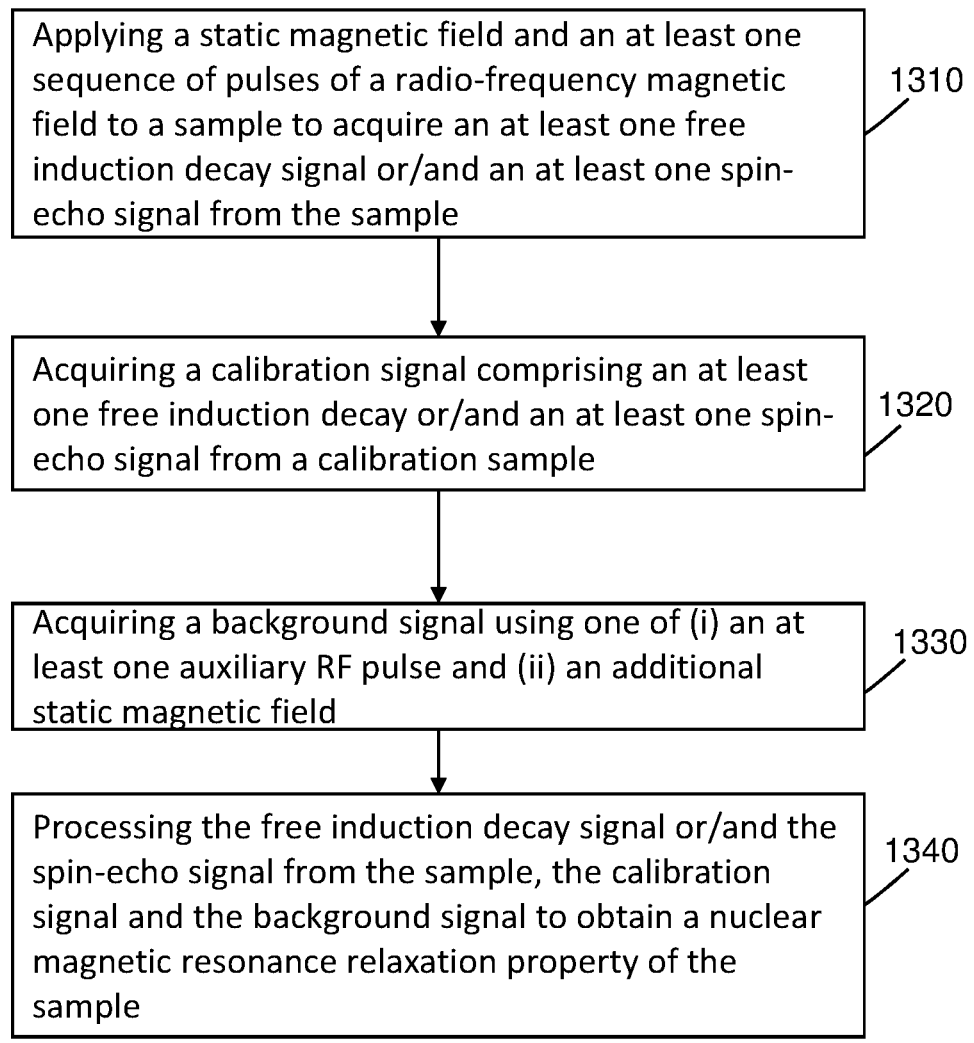
FIG. 13 illustrates a method of using a free induction decay signal in combination with the spin-echo signals to acquire NMR relaxation data.

FIG. 13 presents an embodiment of a method of present disclosure. The method uses a combination of FID signals and spin-echo signals to obtain NMR relaxation properties of a sample. The sample may be a sample of a borehole material. The method enables low frequency (low frequency is preferably used to match NMR frequency of downhole NMR logging tools NMR) measurements with high relaxation spectrum resolution to acquire relaxation data on samples having fast relaxation components. The first step 1310 of the method is to apply a static magnetic field and an at least one sequence of RF pulses (e.g., shown in FIG. 12 at 1200) of a radio-frequency magnetic field to the sample to acquire an at least one free induction decay signal and an at least one spin-echo signal. The second step 1320 is to acquire a calibration signal comprising an at least one free induction decay signal from a calibration sample and an at least one spin-echo signal from the calibration sample. The static magnetic field and the radio-frequency magnetic field define a sensitivity volume. An embodiment of the method of FIG. 13 may include a step 1330 of acquiring a background signal. The background signal may include a ringing signal, an offset voltage signal and a signal from a residual hydrogen present in the sensitivity volume (without having the sample in the sensitivity volume). Acquiring the background signal uses one of (i) an at least one auxiliary RF pulse and (ii) an additional (auxiliary) static magnetic field. The additional static magnetic field is used to substantially spoil (eliminate) the sensitivity volume in the sample. The at least one free induction decay signal from the sample, the at least one spin-echo signal from the sample, the calibration signal and the background signal are processed to obtain a nuclear magnetic resonance relaxation property of the sample (step 1340). An example of the processing is described above (including equations (6)-(12)).

Another embodiment of the present disclosure is method to acquire a nuclear magnetic resonance data on a sample. The method includes applying a static magnetic field to the sample, generating an at least one sequence of pulses of a radio-frequency magnetic field in the sample (the static magnetic field and the radio-frequency magnetic field defining a sensitivity volume) and acquiring the NMR relaxation signal from the sample. The method further comprises acquiring a background signal and processing the nuclear magnetic resonance signal jointly with the background signal to eliminate the background signal effect on the nuclear magnetic resonance data. As in the preferred embodiment described above the step of acquiring the background signal may include applying an additional static magnetic field to substantially eliminate the sensitivity volume in the sample. Also, the step of acquiring of the background signal may include providing relative mechanical displacement between the sensitivity volume and the sample. As explained above, the at least one sequence of pulses of a radio-frequency magnetic field in the sample has a waiting time and the step of acquiring of the background signal may be performed during the waiting time.

Another aspect of the present disclosure is an apparatus to acquire a nuclear magnetic resonance data on a sample. The apparatus comprises a magnet to generate a static magnetic field in the sample, an antenna to serve as at least one of (i) a source of a radio-frequency magnetic field and (ii) a receiver to receive nuclear magnetic resonance signals. The static magnetic field and the radio-frequency magnetic field define a sensitivity volume. The apparatus has means to acquire a background signal, the means comprising an at least one of (i) an actuator providing relative mechanical displacement between the sensitivity volume and the sample to remove the sample from the sensitivity volume and (ii) an auxiliary source of a static magnetic field to substantially spoil a nuclear magnetic resonance excitation in the sample. The effect of the background signal on the nuclear magnetic resonance data is eliminated (e.g. using a processing software) to obtain NMR relaxation properties of the sample.

While the invention has been described with respect to a limited number of embodiments, those skilled in the art, having benefits of this disclosure, will appreciate that other embodiments can be devised which do not depart from the scope of invention as disclosed herein.

What I claim as my invention is:

1. A method for nuclear magnetic resonance measurement on a sample of a borehole material, comprising:
    applying a static magnetic field to the sample;
    generating an at least one sequence of pulses of a radio-frequency magnetic field in the sample;
    acquiring an at least one free induction decay signal from the sample, the free induction decay signal producing at least one data point having a time of occurrence;
    acquiring an at least one spin-echo signal from the sample, the at least one spin-echo signal having a time-to-echo parameter, the time of occurrence being shorter than the time-to-echo to enable detecting first relaxation components of the nuclear magnetic resonance relaxation;
    acquiring a calibration signal, comprising an at least one free induction decay signal from a calibration sample and an at least one spin-echo signal from the calibration sample, the acquiring a calibration signal performed to match scales of the free induction decay signal from the sample and the spin-echo from the sample; and
    processing jointly the at least one free induction decay signal from the sample, the at least one spin-echo signal from the sample and the calibration signal to obtain a nuclear magnetic resonance relaxation property of the sample, the processing including matching scales of the free induction decay signal from the sample and the spin-echo signal from the sample.

2. The method of claim 1, further comprising handling a background signal to eliminate the effect of the background signal on a reading of the magnetic resonance relaxation property.

3. The method of claim 2, wherein the step of handling a background signal comprises acquiring the background signal and processing the background signal together with the at least one free induction decay signal from the sample, the at least one spin-echo signal from the sample and the calibration signal to obtain the nuclear magnetic resonance relaxation property of the sample.

4. The method of claim 2, wherein the step of handling a background signal includes handling an at least one of (i) a ringing signal, (ii) an offset voltage signal and (iii) a signal from residual hydrogen.

5. The method of claim 1, wherein the step of generating an at least one sequence of pulses of a radio-frequency magnetic field comprises generating an excitation radio-frequency pulse and a plurality of refocusing radio-frequency pulses to acquire an at least one free induction decay signal and a plurality of spin-echo signals.

6. The method of claim 1, wherein the step of generating an at least one sequence of pulses of a radio-frequency magnetic field comprises generating a first sequence to acquire a plurality of spin-echo signals and generating a second sequence to acquire an at least one free induction decay signal.

7. The method of claim 3, wherein the step of acquiring the background signal includes applying an at least one auxiliary excitation radio-frequency pulse and acquiring a voltage signal after the at least one auxiliary excitation radio-frequency pulse.

8. The method of claim 2, wherein the step of handling a background signal includes applying an at least one inverting radio-frequency pulse before the excitation pulse to invert (to change by 180°) a phase of the free induction decay signal.

9. The method of claim 3, wherein the step of acquiring the background signal includes applying an additional static magnetic field to substantially eliminate nuclear magnetic resonance excitation in the sample.

10. The method of claim 3, wherein the step of acquiring the background signal includes providing relative mechanical displacement between the sensitivity volume and the sample.

11. The method of claim 2, wherein the at least one sequence of pulses of a radio-frequency magnetic field in the sample has a waiting time to recover a nuclear magnetization in the sample and at least one of (i) the step of handling the background signal and (ii) the step of acquiring of the calibration signal is performed during the waiting time.

12. The method of claim 2, wherein the at least one of (i) the step of handling the background signal and (ii) the step of acquiring the calibration signal is performed before or after the at least one sequence of pulses of a radio-frequency magnetic field.

13. A method to acquire nuclear magnetic resonance data, the method comprising:
applying a static magnetic field to a sample;
generating an at least one sequence of pulses of a radio-frequency magnetic field in the sample, the static magnetic field and the radio-frequency magnetic field providing a nuclear magnetic resonance excitation in the sample;
detecting a total signal in response to nuclear magnetic resonance excitation in the sample, the nuclear magnetic resonance signal including a free induction decay signal, a spin-echo signal and a background signal;
acquiring a background signal, the background signal including a spurious signal after the excitation radio-frequency pulse used to generate free induction decay signal; and
processing the nuclear magnetic resonance signal jointly with the background signal to eliminate the background signal effect on the nuclear magnetic resonance data, the processing including subtracting the background signal from the total signal.

14. The method of claim 13, wherein the step of acquiring the background signal includes acquiring at least one of (i) a ringing signal, (ii) an offset voltage signal and (iii) a signal from residual hydrogen.

15. The method of claim 13, wherein the step of acquiring the background signal includes applying an at least one auxiliary excitation radio-frequency pulse and acquiring a voltage signal after the at least one auxiliary excitation radio-frequency pulse.

16. The method of claim 13, wherein the step of acquiring the background signal includes substantially eliminating nuclear magnetic resonance excitation in the sample by applying an additional static magnetic field.

17. The method of claim 13, wherein the step of acquiring the background signal uses a fast stacking of the background signal data to introduce substantially no additional noise in the step of processing.

18. The method of claim 13, wherein the step of acquiring the background signal includes providing relative mechanical displacement between a sensitivity volume and the sample.

19. The method of claim 13, wherein the at least one sequence of pulses of a radio-frequency magnetic field in the sample has a waiting time to recover a nuclear magnetization in the sensitivity volume of the sample and the step of acquiring the background signal is performed during the waiting time.

20. An apparatus to acquire nuclear magnetic resonance data, the apparatus comprising:
a magnet to apply a static magnetic field to a sample;
an antenna to serve as at least one of (i) a source of a radio-frequency magnetic field and (ii) a receiver to receive nuclear magnetic resonance signals, the static magnetic field and the radio-frequency magnetic field providing nuclear magnetic resonance excitation in the sample; and
an auxiliary source of a static magnetic field, the auxiliary source configured to provide an additional static magnetic field that substantially spoils nuclear magnetic resonance excitation in the sample, the background signal being acquired to eliminate an effect of the background signal on the nuclear magnetic resonance data.

* * * * *